United States Patent
Kim

(10) Patent No.: US 7,990,755 B2
(45) Date of Patent: Aug. 2, 2011

(54) DRAM INCLUDING PSEUDO NEGATIVE WORD LINE

(76) Inventor: Juhan Kim, San Jose, CA (US)

(*) Notice: Subject to any disclaimer, the term of this patent is extended or adjusted under 35 U.S.C. 154(b) by 37 days.

(21) Appl. No.: 12/689,228

(22) Filed: Jan. 19, 2010

(65) Prior Publication Data

US 2010/0254179 A1 Oct. 7, 2010

Related U.S. Application Data

(63) Continuation of application No. 12/417,594, filed on Apr. 2, 2009, now Pat. No. 7,633,791, and a continuation of application No. 12/426,271, filed on Apr. 19, 2009, now Pat. No. 7,626,848.

(51) Int. Cl.
*G11C 11/24* (2006.01)
(52) U.S. Cl. .......... 365/149; 365/145; 365/189.15; 365/189.16; 365/194; 365/205
(58) Field of Classification Search .......... 365/145, 365/149, 189.15, 189.16, 194, 205
See application file for complete search history.

(56) References Cited

U.S. PATENT DOCUMENTS

| | | | |
|---|---|---|---|
| 5,715,189 A | 2/1998 | Asakura | |
| 6,426,905 B1 | 7/2002 | Dennard et al. | |
| 6,456,521 B1 | 9/2002 | Hsu et al. | |
| 2010/0182846 A1* | 7/2010 | Kim | 365/185.25 |

OTHER PUBLICATIONS

A hierarchical bit-line architecture with flexible redundancy and block compare test for 256 Mb DRAM in VLSI Circuits, Digest of Technical Papers, May 1993.
A 322 MHz Random-Cycle Embedded DRAM With High-Accuracy Sensing and Tuning, IEEE Journal of Solid-State Circuits, vol. 40, No. 11, Nov. 2005.
A 500MHz Random Cycle 1.5ns-Latency, SOI Embedded DRAM Macro Featuring a 3T Micro Sense Amplifier, IEEE International Solid-State Circuits Conference, pp. 486, 2007.

* cited by examiner

*Primary Examiner* — Hoai V Ho

(57) ABSTRACT

For increasing retention time in DRAM, pseudo negative word line scheme is realized such that voltage of a local bit line pair is always higher than that of an unselected word line for applying negative gate voltage, but selected word line is asserted to a pre-determined voltage. For implementing the scheme, swing voltage of the local bit line pair is limited by a write path connecting to a global bit line pair when writing, and the local bit line pair is also limited when reading, because selected local bit line is slightly changed with charge re-distribution and unselected local bit line is at floating state. For minimizing sensing current, a locking signal is generated to cut off a current path from the global bit line pair to a local sense amp. And various alternative circuits are described for implementing the pseudo negative word line scheme.

14 Claims, 9 Drawing Sheets

DRAM INCLUDING PSEUDO NEGATIVE WORD LINE

CROSS REFERENCE TO RELATED APPLICATION

The present invention is a continuation of application Ser. No. 12/417,594 filed on Apr. 2, 2009, now U.S. Pat. No. 7,633,791, application Ser. No. 12/426,271 filed on Apr. 19, 2009, now U.S. Pat. No. 7,626,848, and which are herein incorporated by reference.

FIELD OF THE INVENTION

The present invention relates generally to integrated circuits, in particular to DRAM (Dynamic Random Access Memory).

BACKGROUND OF THE INVENTION

For its high-density, the DRAM (Dynamic Random Access Memory) is utilized extensively as a main memory in computer systems, even though it requires refresh cycle to sustain stored data within a predetermined refresh time. As such, the DRAM constitutes a key component that holds sway on the performance of the computer system. Efforts of research and development have been under way primarily to boost the density and also speed improvement.

In the conventional DRAM, hierarchical bit line architecture is applied to achieve high-speed operation, as published, "Hierarchical bitline DRAM architecture system" as U.S. Pat. No. 6,456,521, and "A hierarchical bit-line architecture with flexible redundancy and block compare test for 256 Mb DRAM" in VLSI Circuits, Digest of Technical Papers, May 1993. pp 93-94. More specifically, FIG. 1 illustrates a circuit diagram of the conventional DRAM. The memory cells 101 and 102 are connected to a local bit line 131, and the memory cells 103 and 104 are connected to another local bit line 133, where the plate of capacitor is connected to half supply voltage typically. Local bit lines 131 and 133 are connected to a global bit line 111 and another global bit line 112 through transfer transistors 121 and 123, respectively. And more local bit lines 132 and 134 are connected to the global bit lines 111 and 112, respectively. When reading, one of memory cells is selected, and the selected cell charges or discharges the local bit line while the local bit lines and the global lines are released from pre-charge node 117, such that equalizer transistor 113, pre-charge transistors 114 and 115 are turned off by a control signal 116. Thus, one of global bit lines is also charged or discharged by the selected memory cell. After then sense amp 141 is activated to generate a read output 142. However, the selected global bit line is slowly changed because the selected memory cell should drive local bit line and global bit line through transfer transistor, where the global bit line increases total capacitance. Moreover, the storage capacitor in the memory cell should be relatively big in order to absorb the charges from the global bit line, which is one of major obstacles to reduce the DRAM cell. As a result, access time is also slow because of heavy global bit line, which increases propagation delay and sensing time for the sense amp.

And there is a prior art for improving DRAM with adding a local sense amp, as published, "High speed DRAM local bit line sense amplifier", U.S. Pat. No. 6,426,905, wherein the local sense amplifier detects a change of charge out of an input node, and comprises a first current source and a first field effect transistor. The current source is provided for removing charge from the input node. The field effect transistor includes (i) a source coupled to the input node, (ii) a gate electrode coupled to a first voltage, and (iii) a drain coupled to one side of a first capacitor, to an output node, and to a pre-charge circuit for setting the voltage of the output node to a second voltage, providing a voltage difference between the drain and source of said first transistor. The other side of the capacitor is coupled to ground. However, many transistors (total 11 transistors) for each local sense amplifier are required, such that chip area is sacrificed for the improvement.

And more prior arts are shown for dividing the bit line into short lines, "A 322 MHz Random-Cycle Embedded DRAM With High-Accuracy Sensing and Tuning", IEEE Journal of Solid-State Circuits, Vol. 40, No. 11, November, 2005, and "A 500 MHz Random Cycle 1.5 ns-Latency, SOI Embedded DRAM Macro Featuring a 3T Micro Sense Amplifier", IEEE International Solid-State Circuits Conference, pp. 486, 2007. However, those prior arts still use conventional differential sense amplifier for reading data from the memory cell. In consequence, the area of the chip is increased more, which is one of obstacles for realizing very high density and high speed memory.

Furthermore, memory cell structure of the conventional DRAM includes a cup-like capacitor as published U.S. Pat. No. 7,183,603 and a deep trench capacitor as published U.S. Pat. No. 6,608,341. Hence, scaling the big storage capacitor is one of major obstacles, because total storage capacitance should be maintained around 20-30 fF for reading the memory cell through a heavy bit line and also retaining data within same or longer refresh time. In order to avoid forming the big storage capacitor, sensing scheme should be improved to read a reduced capacitor memory cell, which also should improve access time. And in order to retain data for long time even though the capacitor is reduced, leakage current of the memory cell should be reduced with pseudo negative word line scheme. More detailed explanation will be described as below.

SUMMARY OF THE INVENTION

In the present invention, DRAM including pseudo negative word line is realized such that voltage of a local bit line is always higher than that of a word line when activated or standby, which means that voltage of the word line is lower than that of the local bit line while storing a data. Thus, the memory cell is less disturbed even though the local bit line voltage is changed for reading and writing the other memory cell connecting to the same local bit line. For example, the local bit line is changed from 0.5V to 1.5V when reading and writing, while the word line keeps 0V when storing a data. In doing so, leakage current of the memory cell is significantly reduced in logarithmic subthreshold region. For implementing the scheme, swing voltage of the local bit line is limited by a write path when writing, and the local bit line is re-distributed with stored charges of the memory cell when reading, which changes voltage of the local bit line very slightly.

In the configuration, a plurality of memory cells is connected to a short local bit line, and the short local bit line is connected to a local sense amp for reducing bit line capacitance. And the local sense amp is connected to a global sense amp through a global bit line pair for reading and writing data. There are many advantages with the short bit line architecture. One of prime advantages is that a storage capacitor can be reduced. On the contrary, the conventional DRAM uses a cup-like big capacitor, such as, 20~30 fF, as the storage capacitor. Hence, it is more difficult to fabricate the big capacitor on the wafer in the near future, because feature size is approaching to almost scaling limit. In order to overcome the scaling limit, the short bit line architecture is useful to apply the reduced capacitor as a storage capacitor in the DRAM.

For reading a stored data from the memory cell through the short local bit line, a read path is set up, wherein the read path includes the local sense amp and the global sense amp. And the local sense amp is connected to the global sense amp through a global bit line pair. The memory cell is connected to the local bit line. The local sense amp is composed of a pair of local pre-charge transistors pre-charging the local bit line pair to a local pre-charge voltage, a pair of local amplify transistors for receiving voltage difference of the local bit line pair after charges from one of the memory cells is transferred to one of the local bit lines, a pair of local enable transistors connecting to the pair of local amplify transistors for setting up a pair of current paths for charging or discharging one of the global bit lines quickly, and charging or discharging another one of the global bit lines slowly, when reading. And the global sense amp is composed of a pair of global pre-charge transistors pre-charging the global bit line pair, a global cross-coupled latch for storing a read data, as an example configuration.

And for writing a write data to the memory cell through the short local bit line, a write path is set up, wherein the write path includes the global sense amp connecting to the global bit line pair, a pair of local write transistors of the local sense amp for connecting the global bit line pair to the local bit line pair. When writing, one of the global bit lines is driven to a supply voltage or a highest voltage, and another one of global bit lines is driven to a VL voltage by the global sense amp, and where the VL voltage is higher than a ground voltage or a lowest voltage, and the local pre-charge voltage to the local pre-charge transistors is a middle voltage between the VL voltage and the supply voltage or the highest voltage. Alternatively, a reverse configuration may be composed of reverse polarity and reverse circuits.

For implementing the pseudo negative word line scheme, there is no need to add a negative charge pump circuit, because the word line is asserted to a ground voltage, not a physical negative voltage, when unselected, while the local bit line pair is always high than that of the word line with the read path and the write path for limiting swing voltage of the local bit line, when activated and standby.

Furthermore, various alternative configurations are described for implementing the pseudo negative word line scheme.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
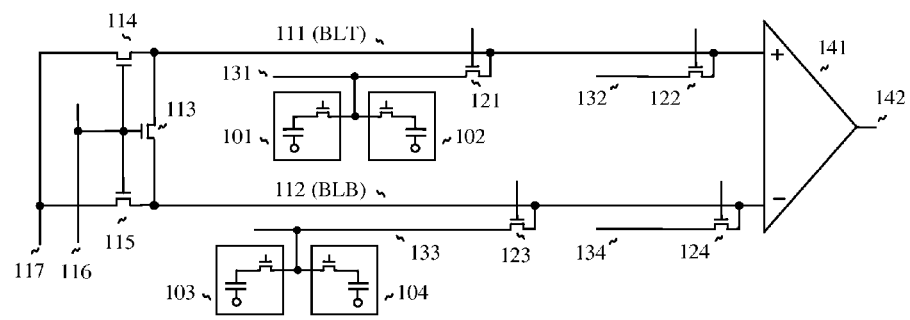
FIG. 1 illustrates a dynamic random access memory, as a prior art.
Figure 2A:
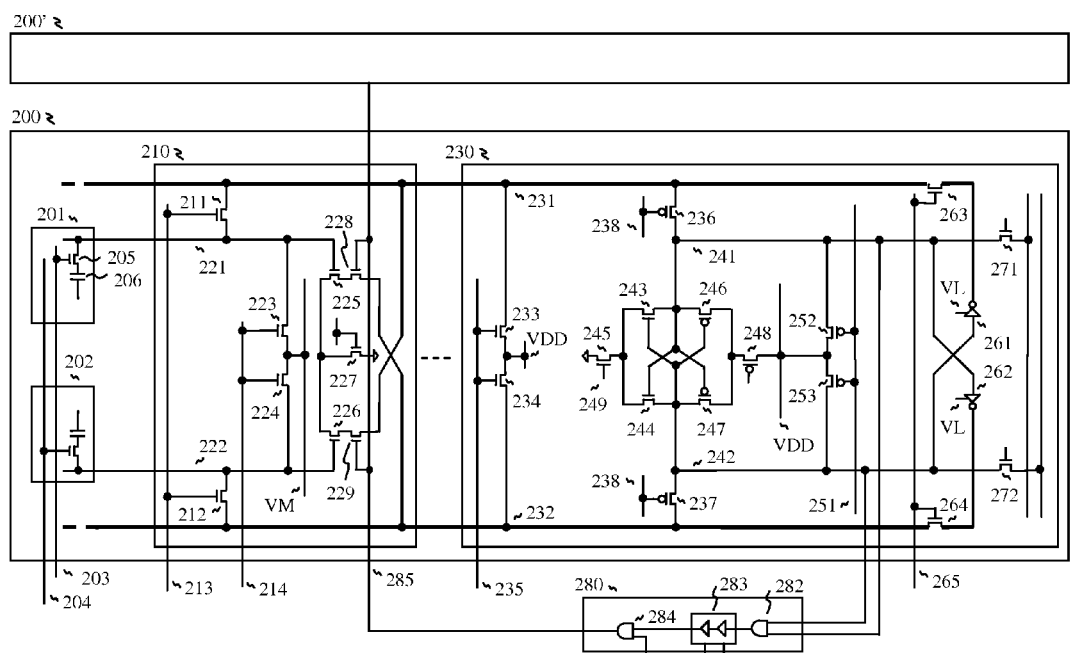
FIG. 2A illustrates DRAM including pseudo negative word line as the present invention.

The present invention is directed to DRAM including pseudo negative word line as shown in FIG. 2A, wherein a memory block 200 comprises a plurality of memory cells including an upper memory cell 201 and a lower memory cell 202, a local sense amp 210, a global sense amp 230, and a locking signal generator 280. The upper memory cell 201 is composed of an NMOS pass transistor 205 and a capacitor 206 which is connected to a plate line. And the lower memory cell 202 is composed of the same circuit as the upper memory cell 201. A word line 203 is connected to the pass transistor for selecting the upper memory cell 201, and the upper memory cell 201 is selected by applying a VPP voltage to the word line 203, while the lower memory cell 202 is selected by the other word line 204, where the VPP voltage is higher than a high voltage as a supply voltage for avoiding threshold voltage drop of the pass transistor.

The local sense amp 210 is connected to the upper memory cell 201 through an upper local bit line 221 and the lower memory cell 202 through a lower local bit line 222. For reducing parasitic capacitance of the local bit line, reduced numbers of memory cells are connected to the local bit lines, such as 16 cells, 24 cells, 32 cells, 48 cells, 64 cells and 128 cells, while 256 cells and 512 cells are connected to the bit lines in the conventional DRAM. In doing so, the storage capacitor can be proportionally reduced for driving the short bit line.

In particular, the local sense amp 210 is composed of only NMOS transistors for reducing area, wherein the local sense amp 210 includes a pair of local pre-charge transistors 223 and 224 for pre-charging the local bit line pair 221 and 222 to a middle pre-charge voltage VM, a pair of local amplify transistors 225 and 226 as a receiving gate pair of a differential input reading transistor pair for reading voltage difference of the local bit line pair 221 and 222, a sink transistor 227 for configuring a differential amplifier with the pair of local amplify transistors 225 and 226, a pair of local enable transistors 228 and 229 connecting the pair of local amplify transistors 225 and 226 in series connection, where a local read enable signal 285 serving as a locking signal enables or disables the pair of local enable transistors 228 and 229 when reading. And a local pre-charge control signal 214 enables the pair of local pre-charge transistors 223 and 224 for pre-charging the local bit line pair 221 and 222 during standby. And a global bit line pair is connected to the pair of local enable transistors 228 and 229 for receiving a read out from the local sense amp, wherein the global bit line pair includes an upper global bit line 231 and a lower global bit line 232.

Advantage with the local sense amp is to reduce area, such that nine transistors configure the local sense amp. And the local bit line swing is limited such that the local bit line is 0.5 v higher than that of the word line at a ground voltage or a low voltage when unselected for realizing the pseudo negative word line. During read, charges of the local bit line are redistributed with charges at the local bit line which is pre-charged at the VM voltage. Hence, the local bit line voltage is near the VM voltage. During write, the global bit line transfers a write voltage from the VL voltage or the high voltage from the global sense amp 260.

For reading the upper memory cell 201, the word line 203 is asserted to the VPP voltage, which turns on the pass transistor. Thus, the upper local bit line voltage 221 is slightly raised or lowered by stored charges in the storage capacitor. For example, when data "1" is stored in the memory cell 201, the upper local bit line 221 is raised to 1.1V from the VM voltage, where the VM voltage is 1V and the high voltage is 1.5V, while the pair of write transfer transistors 211 and 212, and the local pre-charge transistors 223 and 224 are at turn-off state during read operation. And then, by enabling the pair of local enable transistors 228 and 229, the upper global bit line 231 is quickly discharged and the lower global bit line 232 is slowly discharged, because gate voltage of the local amplify transistor 225 as receiving gate is, for instance, 100 mV higher than that of the other receiving gate 226.

In contrast, when data "0" is stored in the memory cell 201, the upper global bit line 231 is slowly discharged while the lower global bit line 232 is quickly discharged, because gate voltage of the local amplify transistor 225 is 100 mV lower than that of the other receiving gate 226, where parasitic capacitance of the global bit line pair is relatively higher than that of the local bit line pair in the short bit line architecture.

By discharging one of the global bit lines quickly, the global sense amp 230 amplifies the voltage difference and stores the read data, wherein the global sense amp 230 is composed of a pair of global pre-charge transistors 233 and 234 pre-charging the global bit line pair 231 and 232, a global cross-coupled latch connecting to the global bit line pair, a pair of global pre-set transistors 252 and 253 for pre-setting the global cross-coupled latch which includes a pair of global latch nodes 241 and 242, a pair of global write drivers having a pair of level shifters 261 and 262 which is connected to the pair of global latch nodes 241 and 242, a pair of global write transistors 263 and 264 for transferring a write data from the pair of global write drivers to the global bit line pair, and a pair of data transfer transistors 271 and 272 for connecting the global latch nodes 241 and 242 to a pair of data lines. The global cross-coupled latch is composed of a pair of global pull-down transistors 243 and 244 connecting to the global latch nodes and a global pull-down enable transistor 245, and a pair of pull-up transistors 246 and 247 connecting to the global latch nodes and a global pull-up enable transistor 248, a pair of global read select transistors 236 and 237 for connecting the global bit line pair to the pair of global latch nodes 241 and 242. The pair of global read select transistors 236 and 237 is controlled by a global read enable signal 238. The pair of global pre-set transistors 252 and 253 is controlled by a global pre-set control signal 251. And the global pull-down enable transistor 245 of the global cross-coupled latch is enabled by a global read enable signal 249.

Figure 4A:
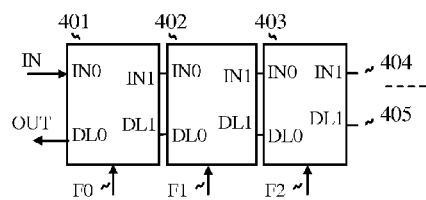
FIG. 4A illustrates a tunable delay circuit.

When reading, the local sense amp and the global sense amp dissipate current. Furthermore, a penetration current may flow from the global sense amp to the local sense amp. In order to minimize the current, the locking signal generator 280 generates a locking signal which enables and disables the local sense amp for cutting off the current path after reading, wherein the locking signal generator 280 is composed of an AND gate 282 for receiving at least an output from the global sense amp 230, a tunable delay circuit 283 (as shown in FIG. 4A) for delaying the read output of the global sense amp 230, and another AND gate 284 for generating the locking signal 285, while a read enable signal 281 is asserted to high. When the locking signal 285 is lowered to a ground voltage or a low voltage, the local sense amp in the reference column 200 is locked, and main column 200' is also locked by the locking signal for reducing the current consumption. Furthermore, by locking or disabling the local sense amp, swing voltage of the global bit line pair is limited before fully discharging, which helps to maintain the global bit line pair higher than that of the word line, for realizing the pseudo negative word line. For instance, the local sense amp is disabled after the global sense amp latches a read output, but one of the global bit lines is still discharging and another one of the global bit lines keeps near the high voltage. At the time, the locking signal can stop discharging the global bit line after reading, because the read operation is much faster than discharging time only if the global bit line relatively longer than that of the local bit line. And the discharged global bit line will be used for writing back to data "0", if the read data is restored without overwritten from the external data input. Without locking, the local sense amp is enabled for long time, such that the global bit line is fully discharged. Hence, the VL voltage generator (not shown) should be strong enough to pull up to the VL voltage within a given time, which needs more time for writing back, and more power consumption.

And after reading, the global pre-charge transistors 233 and 234 having NMOS transistors are shortly turned on for raising one of the global bit lines while the other global bit line is already reached to the high voltage by the global sense amp, as a preparation of a write operation. For example, the lower global bit line 232 is raised to VDD-VT voltage by the transistor 234, while the upper global bit line 231 is already reached to the high voltage or a supply voltage, where VT is threshold voltage of the MOS transistor 234. In this manner, swing voltage of the global bit line pair is limited by the short pre-charge transistor 234, which maintains the global bit line at least equal or higher than the VL voltage which is supplied by the voltage regulator (not shown), for realizing the pseudo negative word line. Otherwise, one of the global bit lines reaches to the low voltage, and which voltage may be transferred to the local bit line when writing operation is quickly executed. When the local bit line voltage is lower than the VL voltage, subthreshold leakage current of the unselected memory cells is dramatically increased, which reduces retention time.

For writing, a write path is set up wherein the write path includes the pair of global write drivers driving the global bit line pair through the pair of global write transistors 263 and 264, the pair of local write transistors 211 and 212 connecting the global bit line pair to the local bit line pair. The outputs of the pair of global write drivers having the level shifters 261 and 262 of the global sense amp 260 is transferred to the selected memory cell, so that swing voltage of the local bit line and the global bit line is reduced for realizing the pseudo negative word line. Thereby, a stored voltage of the memory cell is also limited from the VL voltage to the high voltage.

And as an alternative configuration, the connection may be reversed (not shown) such that the sink transistor 227 is connected to the pair of local enable transistors 228 and 229, the pair of local amplify transistors 225 and 226 is connected to the pair of local enable transistors 228 and 229, and the global bit line pair 231 and 232 is connected to the local amplify transistor pair 225 and 226. Another variation is a configuration (not shown) without the sink transistor 227, which equally works for serving as the receiving portion of the differential amplifier for comparing the voltage difference of the local bit line pair, because pull-up transistors 246 and 247 of the global sense amp 230 co-works for sensing when reading.

Figure 2B:
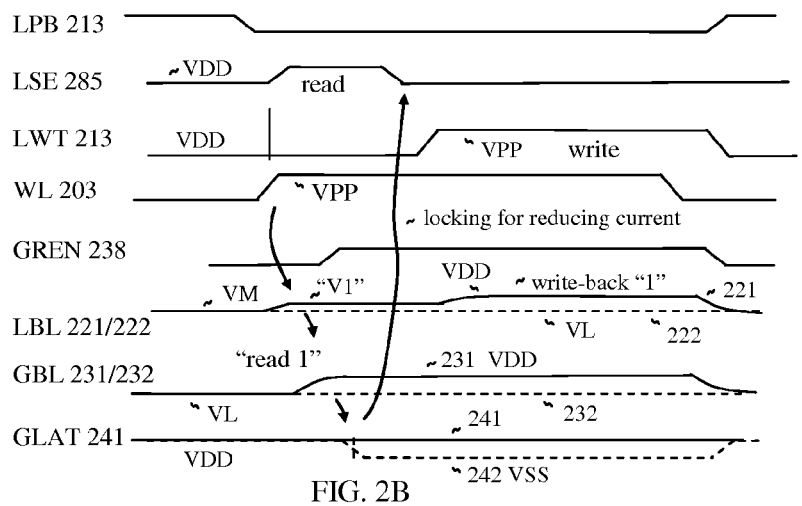
FIG. 2B illustrates timing diagram when reading data "1"

Referring now to FIG. 2B in view of FIG. 2A, detailed timing for reading data "1" is illustrated. To read data, the local pre-charge control signal (LPB) 214 is de-asserted to low for releasing the local bit line pair, and then the word line 203 is raised to the predetermined voltage. By raising the word line, the local bit line (LBL) 221 is charged to V1 voltage from the pre-charge voltage VM, because the memory cell 201 stores high data, while the pair of write transfer transistors 211 and 212 is turned off. And then the local read enable signal (LSE) 285 serving as the locking signal is asserted to high for enabling the local sense amp. Thus the local amplify transistor 225 quickly discharges the upper global bit line 231 while the other global bit line 232 is slowly discharged. After then, for enabling the global sense amp, the global read enable signal 249 is asserted. When the global bit line 231 is discharged quickly, the global sense amp 230 amplifies the difference and stores the read output to the global latch node (GLAT) 241, while the other global latch node 242 stores a negated output while the pair of global per-set transistors 252 and 253 is turned off. After reading, the locking signal disables the local sense amp with lowering the locking signal 285, then write-back operation is executed such that the upper local bit line 221 receives the read output from the upper global bit line 231 for writing back to the memory cell through the global write driver of the global sense amp 230 and the local write transistor when the local write enable signal 213 is asserted. At the same time, the other local bit line 221 also receives a voltage from the other global bit line 232, but no write operation is executed to the unselected memory cells because no word line is asserted in the other local bit line 207. And signal numbers are the same as those of FIG. 2A, when reading data "1".

Figure 2C:
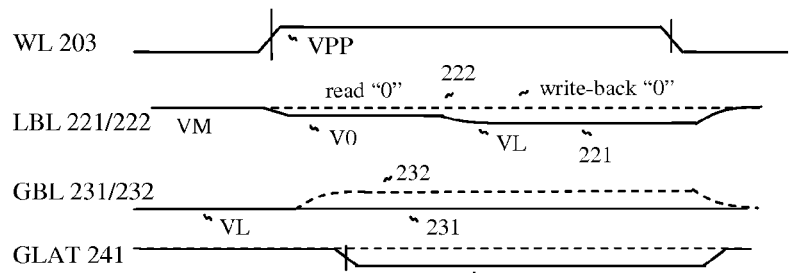
FIG. 2C illustrates timing diagram when reading data "0"

Referring now to FIG. 2C in view of FIG. 2A, detailed timing for reading data "0" is illustrated. To read data, the local pre-charge control signal (LPB) 214 is de-asserted to low for releasing the local bit line pair, and then the word line 203 is asserted. By asserting the word line, the local bit line (LBL) 221 is discharged to V0 voltage from the pre-charge voltage VM, because the memory cell 201 stores low data, while the pair of write transistors 211 and 212 is turned off. And then the local read enable signal (LSE) 285 is asserted to high for enabling the local sense amp. Thus the local amplify transistor 225 slowly discharges the upper global bit line 231 while the other global bit line 232 is quickly discharged. When the global bit line 231 is discharged, the global sense amp 230 amplifies the difference and stores the read output to the global latch node (GLAT) 241, where the other global latch node 242 stores a negated output while the pair of global per-set transistors 252 and 253 is turned off. After reading, the locking signal disables the local sense amp, and then write-back operation is executed as explained above.

Figure 2D:
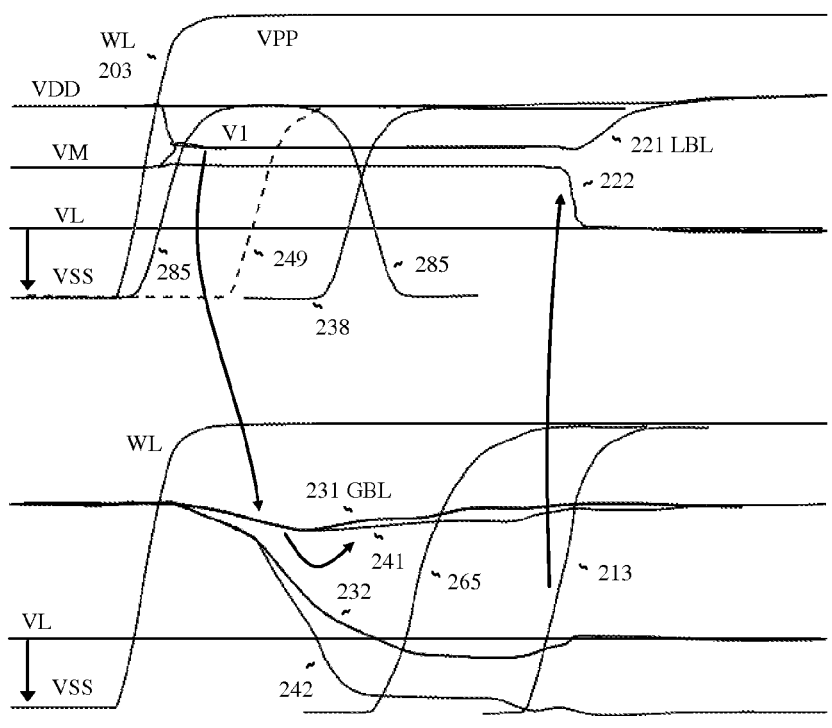
FIG. 2D illustrates simulated waveforms when reading data "1"

In FIG. 2D, simulated waveforms (which are duplicated from the SPICE circuit simulator output with painstaking) are illustrated when reading data "1", wherein stored charges in the storage node (SN) is re-distributed with charges in the local bit line (LBL) 221 after the word line (WL) 203 is asserted to a pre-determined voltage. The local bit line (LBL) 221 is charged to V1 voltage from the VM voltage, by positive charges in the storage node (SN) for data "1". And the global bit line (GBL) 231 is very slowly discharged while the other global bit line is discharged more. By discharging the global bit line, the global latch node (GLAT) 241 is changed to the high voltage. The locking signal 285 is shown for enabling and disabling the local sense amp, and other signals are shown, where the signal numbers are the same as those of FIG. 2A.

Figure 2E:
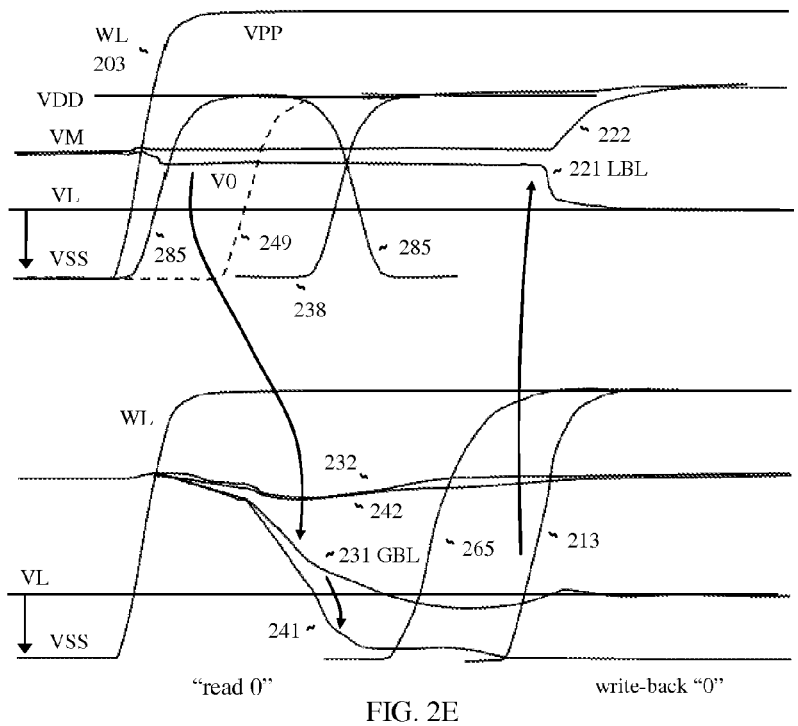
FIG. 2E illustrates simulated waveforms when reading data "0", according to the teachings of the present invention.

In FIG. 2E, simulated waveforms are illustrated when reading data "0", wherein the local bit line (LBL) 221 is discharged to V0 voltage from the VM voltage. Thus, the global bit line (GBL) 231 is quickly discharged while the other global bit line 232 is very slowly discharged. By discharging the global bit line, the global latch node (GLAT) 241 is changed to the low voltage. After latching the read output, the local sense amp is disabled by the local sense amp enable signal (LSE) 285 serving as the locking signal for reducing sensing current.

Figure 3A:
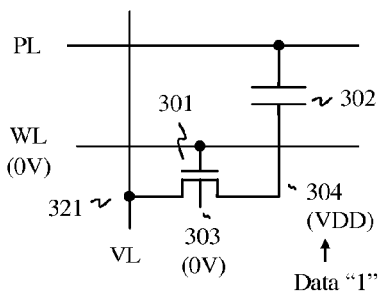
FIG. 3A illustrates a simplified schematic when storing data "1"

And in FIG. 3A, a simplified schematic when storing data "1" is illustrated for explaining the pseudo negative word line scheme, wherein the storage node 304 of a stored cell is at the high voltage, and the storage node 304 is disturbed by the local bit line at the VL voltage while other memory cell is read or written to data "0". Thus, gate-to-source voltage of the pass transistor 301 is negative VL, for example −0.5V, which reduces disturbance leakage from the local bit line to the storage node. Moreover, disturbance leakage is further reduced at standby because the local bit line 321 is pre-charged at the VM voltage, for example 1.0V, so that gate-to-source voltage of the pass transistor 301 is −1.0V.

Figure 3B:
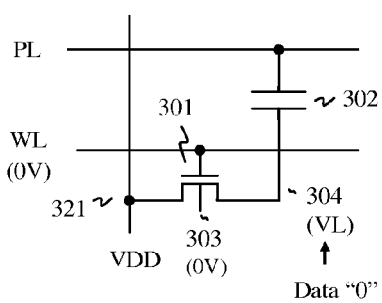
FIG. 3B illustrates a simplified schematic when storing data "0"

As shown in FIG. 3B, when storing data "0", gate-to-source voltage of the pass transistor 301 is −0.5V as well from the storage node 304 to the local bit line 321, while the storage node 304 is charged to the VL voltage, at 0.5V, and the word line 301 is at 0V.

Figure 3C:
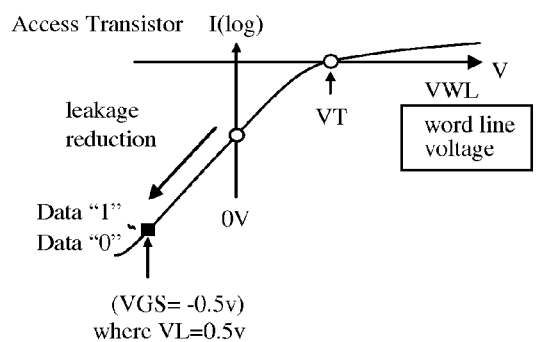
FIG. 3C illustrates subthreshold leakage current curve for the memory cell, according to the teachings of the present invention.

In FIG. 3C, subthreshold leakage current curve of the pass transistor 301 is illustrated, wherein the word line voltage (WL) is negative VL voltage when storing data. As a result, subthreshold leakage current through the pass transistor is exponentially reduced in exponential subthreshold region. Hence, retention time of the present invention is drastically longer than that of the conventional DRAM including 30 fF big capacitor, even though the storage capacitor is reduced.

Furthermore, the body 303 of the pass transistor is forced to ground voltage. On the contrary, the body is forced to negative voltage in the conventional DRAM. With ground body potential, reverse bias leakage current is significantly reduced in exponential reverse bias region as well. Alternatively, the VL voltage can be adjusted by the pre-charge voltage generator with a fuse circuit, which is more flexible for improving retention and sensing operation, such that retention time is increased by raising the VL voltage but sensing margin is reduced as long as a supply voltage VDD is constant. And, various regular dielectric materials can be used for forming the storage capacitor, such as silicon dioxide, silicon nitride, Ta2O5, TiO2, Al2O3, TiN/HfO2/TiN(TIT), and Ru/Insulator/TiN(RIT).

In FIG. 4A, more detailed a tunable delay circuit (as shown 283 in FIG. 2A) is illustrated, wherein multiple delay units 401, 402 and 403 are connected in series, the first delay unit 401 receives input IN and generates output OUT, the second delay unit 402 is connected to the first delay unit, and the third delay unit 403 is connected to the second delay unit 402 and generates outputs 404 and 405, and so on. Each delay unit receives a fuse signal, such that the first delay unit receives F0, the second delay unit receives F1, and a third delay unit receives F2.

Figure 4C:
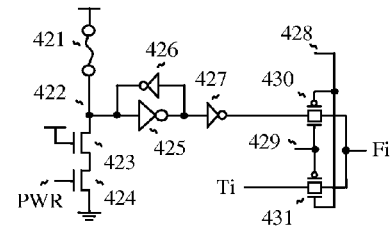
FIG. 4C illustrates a related fuse circuit for the tunable delay circuit.
Figure 4B:
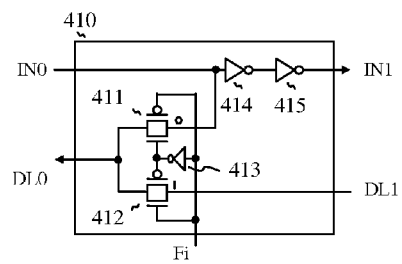
FIG. 4B illustrates a delay unit of the tunable delay circuit.

And more detailed delay unit is illustrated in FIG. 4B, wherein the delay unit 410 receives an input IN0 and a fuse signal F1, thus the fuse signal F1 selects output from the input IN0 or input DL1, so that a transfer gate 411 is turned on when the fuse signal F1 is low and output of inverter 413 is high, otherwise another transfer gate 412 is turned on when the fuse signal F1 is high and output of inverter 413 is low to bypass DL1 signal. Inverter chain 414 and 415 delays IN0 signal for the next delay unit, where more inverter chains or capacitors can be added for the delay even though the drawing illustrates only two inverters.

In FIG. 4C, a related fuse circuit of the tunable delay circuit (as shown in FIG. 4A) is illustrated in order to store information for the delay circuit, so that a fuse serves as a nonvolatile memory, wherein a fuse 421 is connected to a latch node 422, a cross coupled latch including two inverters 425 and 426 are connected to the latch node 422, pull-down transistors 423 and 424 are serially connected to the latch node 422 for power-up reset. Transfer gate 430 is selected by a select signal 429 (high) and another select signal 428 (low) in order to bypass the latch node output 422 through inverter 425 and 427. In doing so, fuse data is transferred to output node F1, otherwise test input T1 is transferred to F1 when a transmission gate 431 is turned on.

Figure 4D:
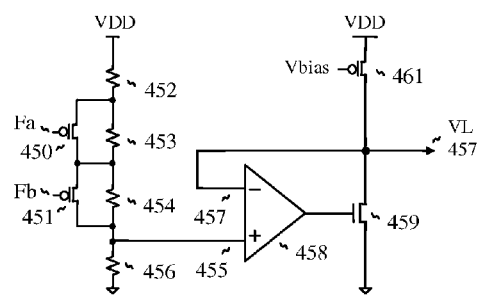
FIG. 4D illustrates a voltage regulator for supplying VL voltage.

In FIG. 4D, a voltage regulator is illustrated for generating the VL voltage to the reduced swing write circuits, wherein a reference voltage 455 is generated by a variable voltage reference circuit, such that a first resistor 452 is connected to a second resistor 453, the second resistor 453 is connected to a third resistor 454, and the third resistor 454 is connected to a fourth resistor 456, serially. In addition, tuning transistors 450 and 451 are connected to the resistors for adjusting voltage output with signals Fa and Fb, respectively. And the control signals Fa and Fb are generated by the fuse circuit as shown in FIG. 4C, where turn-on resistance of the transistor is much smaller than the resistance value of the resistor. And the reference voltage 455 is buffered by an op amp 458, so that the VL voltage is generated by the op amp or a differential amp 458 and a big driver transistor 459. Generally, a voltage difference between two op amp inputs 455 and 457 is equal or very close. In doing so, the VL voltage output is almost equal to the reference voltage 455. And a weak current sink transistor 461 is connected to the VL voltage output 457 for stabilizing the output, wherein the current sink transistor 461 is controlled by a bias voltage Vbias.

Figure 5:
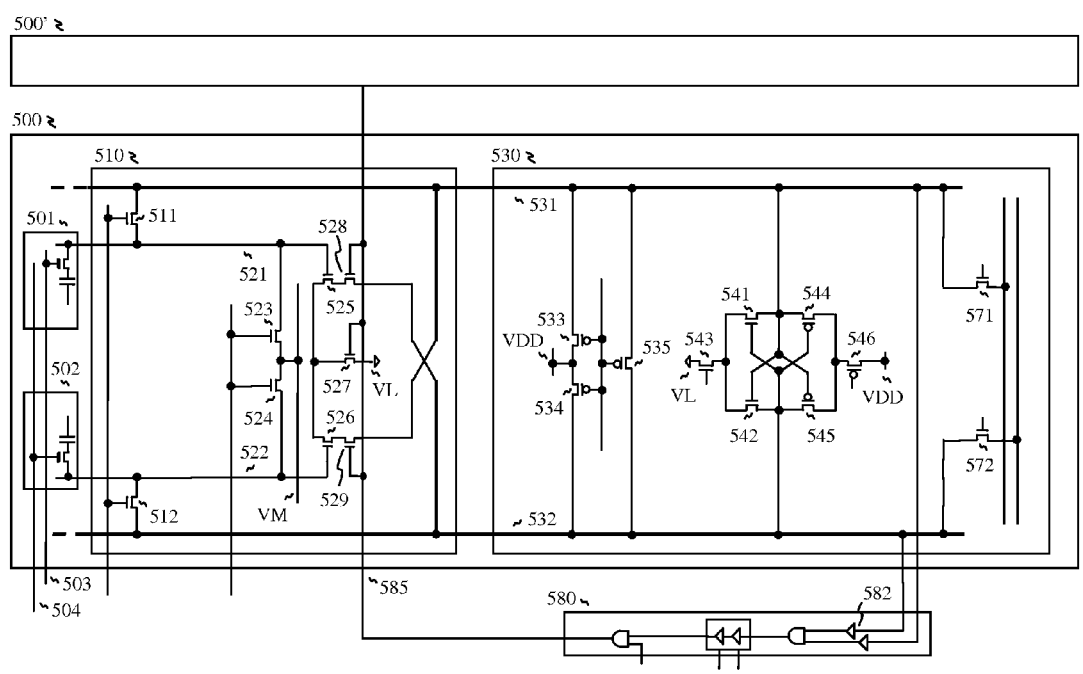
FIG. 5 illustrates an alternative configuration with no level shifter, according to the teachings of the present invention.

And there are various alternative configurations for realizing the pseudo negative word line scheme. As shown in FIG. 5, an alternative configuration without level shifter is illustrated, wherein the local sense amp 510 is connected to a global bit line pair 531 and 532 for transferring a read data to the global sense amp 530, and a write data to the memory cell through the local bit line without level shifter.

In detail, a memory block 500 comprises a plurality of memory cells including an upper memory cell 501 and a lower memory cell 502, a local sense amp 510 and a global sense amp 530, and a locking signal generator 580. The local sense amp 510 is composed of only NMOS transistors for reducing area, wherein the local sense amp 510 includes a pair of local pre-charge transistors 523 and 524 for pre-charging the local bit line pair 521 and 522, a pair of local amplify transistors 525 and 526 as a differential input reading transistor pair for reading voltage difference of the local bit line pair 521 and 522, a sink transistor 527 for configuring a differential amplifier, a pair of local enable transistors 528 and 529 connecting to the pair of local amplify transistors 525 and 526 in series connection, where a local read enable signal 585 as the locking signal enables the local sense amp when reading. And the pair of local enable transistors 528 and 529 is connected to an upper global bit line 531 and a lower global bit line 532.

And the global sense amp is connected to the global bit lines for amplifying the voltage difference of the global bit lines while the local sense amp is enabled, wherein the global sense amp 530 is composed of a pair of global pre-charge transistors 533 and 534 for pre-charging the global bit line pair 531 and 532, an equalization transistor 535 connecting to the global bit line pair, and a global cross-coupled latch connecting to the global bit lines 531 and 532, wherein the global cross-coupled latch is composed of a pair of global pull-down transistors 541 and 542 connecting to a global pull-down enable transistor 543, and a pair of global pull-up transistors 544 and 545 connecting to a global pull-up enable transistor 546. Since the global cross-coupled latch is connected to the global bit line pair, no level shifter is required, but pull-down transistors in the local sense amp and the global sense amp are connected to the VL voltage for limiting the local bit line and the global bit lines, so that the access time may be delayed. For improving the access time, low voltage transistors can be used for the local sense amp and the global sense amp, alternatively.

For reading the memory cell 501, the word line 503 is asserted to the VPP voltage, which turns on the pass transistor, while the other memory cell 502 is not selected by the lower word line 504. Thus, the upper local bit line voltage 521 is slightly raised or lowered by stored charges in the storage capacitor of the selected memory cell 501.

For example, when data "1" is stored in the memory cell 501, the upper local bit line 521 is raised to 1.1V from the VM voltage, where the VM voltage is 1V and the supply voltage VDD is 1.5V, while the pair of write transistors 511 and 512, and the local pre-charge transistors 523 and 524 are at turn-off state during read operation. And then, by enabling the sink transistor 527 and the pair of local enable transistors 528 and 529, the upper global bit line 531 is quickly discharged while the lower global bit line 532 is slowly discharged, because gate voltage of the receiving gate 525 is, for instance, 100 mV higher than that of the other receiving gate 526.

In contrast, when data "0" is stored in the memory cell 501, the upper global bit line 531 is slowly discharged while the lower global bit line 532 is quickly discharged, because gate voltage of the receiving gate 525 is 100 mV lower than that of the other receiving gate 526.

By discharging one of the global bit lines quickly, the global sense amp 530 amplifies the voltage difference and stores the read data with the global cross-coupled latch as explained above. After reading, the read output is transferred to the data line pair when a pair of data transfer transistors 571 and 572 is enabled. And write operation is also executed by turning on the pair of write transistors 511 and 512, where the selected memory cell 501 receives a write data, but the unselected memory cell 502 is not overwritten with unselected word line 504. And the locking signal generator 580 is used for generating the locking signal 585 as explained above, wherein a voltage shifter circuit 582 is used for receiving a reduced voltage from the global sense amp. In the present invention, detailed circuit of the voltage shifter circuit 582 is not drawn because it is out of scope. When the locking signal 585 is lowered to the low voltage or the ground voltage, the local sense amp in the reference column 500 is locked, and main column 500' is also locked by the locking signal for reducing the current consumption.

Figure 6:
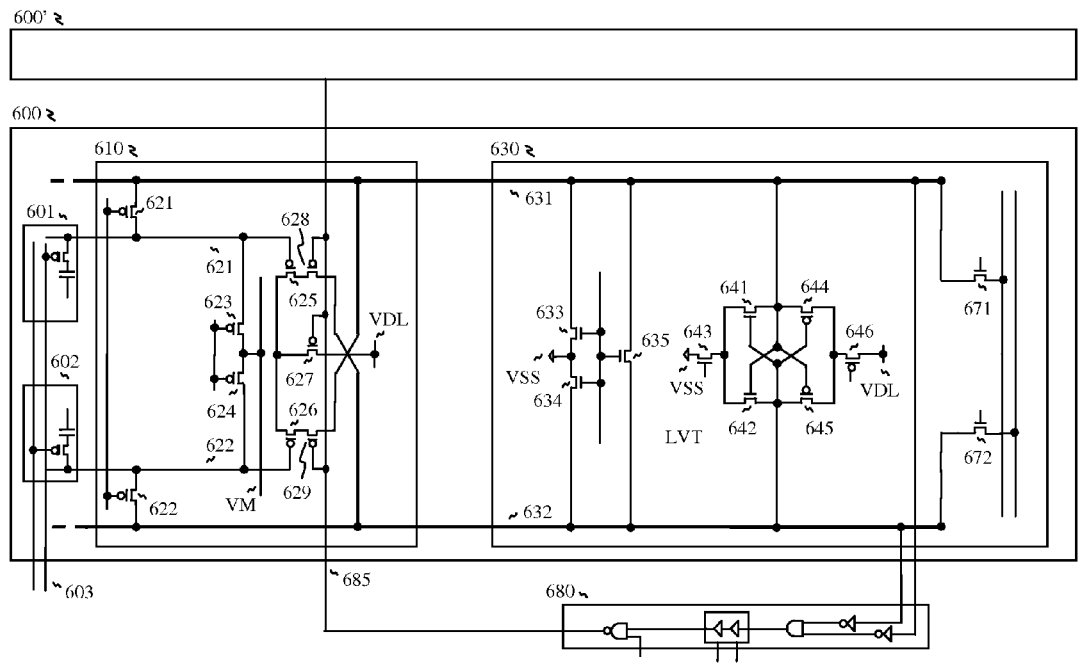
FIG. 6 illustrates an alternative configuration with a reverse configuration having a PMOS memory cell, according to the teachings of the present invention.

In FIG. 6, an alternative configuration with a reverse configuration having a PMOS memory cell is illustrated, wherein the memory cell is composed of the PMOS pass transistor and a capacitor, and the local sense amp is composed of PMOS transistors as well for reading the memory cell.

In detail, a memory block 600 comprises a plurality of memory cells including an upper memory cell 601 and a lower memory cell 602, a local sense amp 610, a global sense amp 630, and a locking signal generator 680. The local sense amp 620 is composed of only PMOS transistors for reducing area, wherein the local sense amp 610 includes a pair of local pre-charge transistors 623 and 624 for pre-charging the local bit line pair 621 and 622, a pair of local amplify transistors 625 and 626 as a differential input reading transistor pair for reading voltage difference of the local bit line pair 621 and 622, an enable transistor 627 for configuring a differential amplifier, a pair of local enable transistors 628 and 629 connecting to an upper global bit line 631 and a lower global bit line 632, where a local read enable signal 685 enables and disables the local sense amp when reading. For realizing the pseudo negative word line scheme, the enable transistor 627 and the global pull-transistors are powered by a VDL voltage, for example, 1.0V, which is lower than the high voltage, for implementing the reverse configuration.

And the global sense amp 630 is connected to the global bit lines for amplifying the voltage difference of the global bit lines, wherein the global sense amp 630 is composed of a pair of global pre-charge transistors 633 and 634 for pre-charging the global bit line pair 631 and 632 to the low voltage, an equalization transistor 635 connecting to the global bit line pair, and a global cross-coupled latch connecting to the global bit lines 631 and 632, wherein the global cross-coupled latch is composed of a pair of global pull-down transistors 641 and 642 connecting to a global pull-down enable transistor 643, and a pair of global pull-up transistors 644 and 645 connecting to a global pull-up enable transistor 646.

The operation is similar to that of FIG. 5 with reverse polarity. For reading the memory cell 601, the word line 603 is asserted to the low voltage, which turns on the pass transistor, while the other memory cell 602 is not selected by the lower word line 604. Thus, the upper local bit line voltage 621 is slightly raised or lowered by stored charges in the storage capacitor of the selected memory cell 601.

For example, when data "0" is stored in the memory cell 601, the upper local bit line 621 is lowered to 0.4V from the VM voltage, where the VM voltage is 0.5V and the supply voltage is 1.5V, while the pair of write transfer transistors 611 and 612, and the local pre-charge transistors 623 and 624 are at turn-off state during read operation. And then, by enabling the enable transistor 627 and the pair of local enable transistors 628 and 629, the upper global bit line 631 is quickly charged while the lower global bit line 632 is slowly charged, because gate voltage of the receiving gate 625 is, for instance, 100 mV lower than that of the other receiving gate 626.

In contrast, when data "1" is stored in the memory cell 601, the upper global bit line 631 is slowly charged while the lower global bit line 632 is quickly charged, because gate voltage of the receiving gate 625 is 100 mV higher than that of the other receiving gate 626.

By charging one of the global bit lines quickly, the global sense amp 630 amplifies the voltage difference and stores the read data with the global cross-coupled latch as explained above. After reading, the read output is transferred to the data line pair when a pair of data transfer transistors 671 and 672 is enabled. And write operation is also executed by turning on the pair of write transistors 611 and 612, where the selected memory cell 601 receives a write data, but the unselected memory cell 602 is not overwritten with unselected word line. And the locking signal generator 680 is composed reverse polarity as well for generating the locking signal 685, wherein voltage swing is reduced from the VSS voltage to the VDL voltage, where the VDL voltage is 1.0V, for instance. When the locking signal 685 is raised to the high voltage, the local sense amp in the reference column 600 is locked, and main column 600' is also locked by the locking signal for reducing the current consumption.

Figure 7:
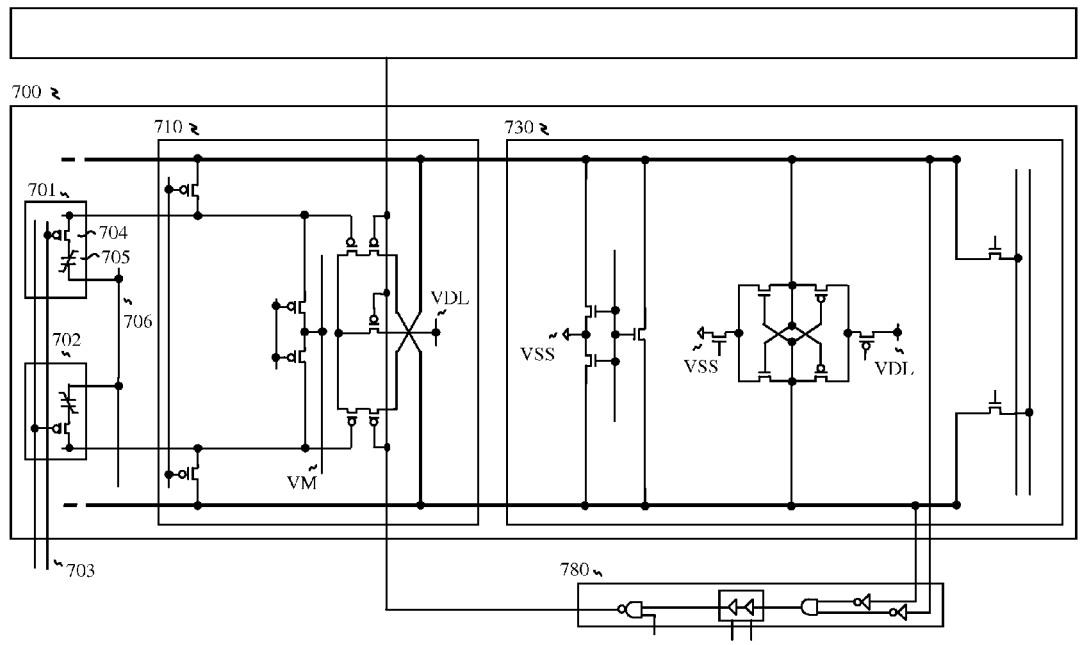
FIG. 7 illustrates an alternative configuration with a ferroelectric capacitor, according to the teachings of the present invention.

In FIG. 7, an alternative configuration with a ferroelectric capacitor as a storage element is illustrated, wherein the memory block 700 comprises the upper memory cell 701 and the lower memory cell 702, the local sense amp 710, the global sense amp 730, and the locking signal generator 780. In particular, the memory cell 701 is composed of a pass transistor 704 and a ferroelectric capacitor 705 as a storage capacitor which is connected to the plate line 706. And the plate line 706 is fixed at a constant voltage source for avoiding reverse polarization, for example at the high voltage. There is a prior art for realizing a volatile memory with a ferroelectric capacitor as a reference, as published in U.S. Pat. No. 5,297, 077, "Memory having ferroelectric capacitors polarized in nonvolatile mode". And other circuits are the same as FIG. 6. Hence, the operation is the same as that of DRAM because the ferroelectric capacitor 705 serves as a volatile storage capacitor with the constant plate line 706, and the ferroelectric capacitor is formed from various materials, such as lead zirconate titanate (PZT), lead lanthanum zirconium titanate (PLZT), barium strontium titanate (BST), and strontium bismuth tantalate (SBT).

Figure 8:
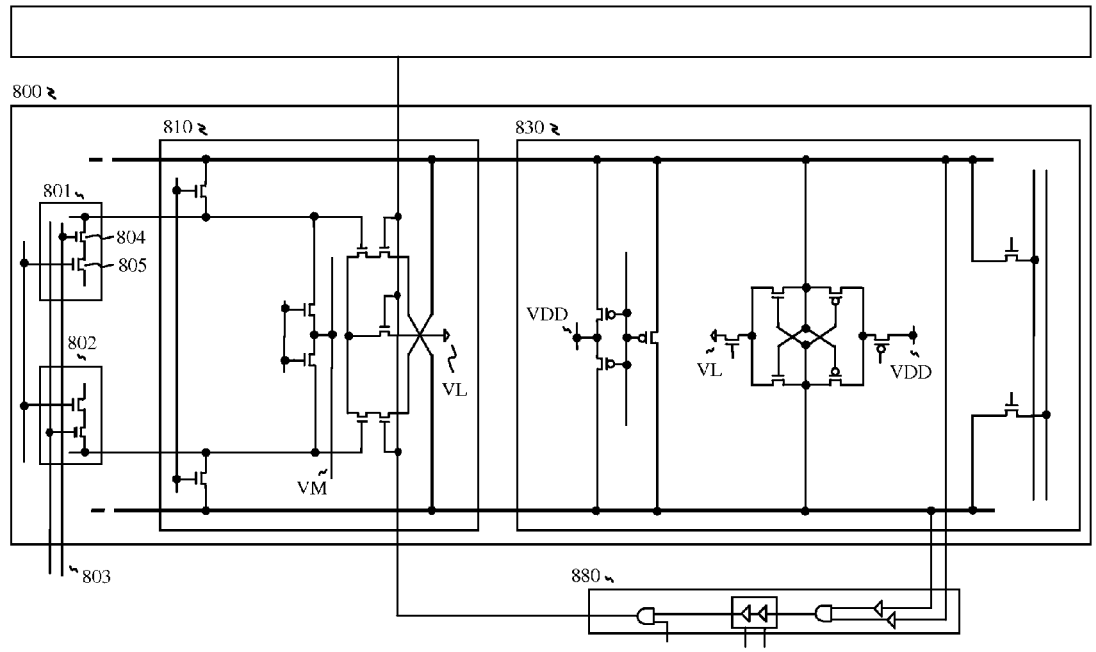
FIG. 8 illustrates an alternative configuration with a gate capacitor, according to the teachings of the present invention.

In FIG. 8, an alternative configuration with a gate capacitor as a DRAM, wherein the memory block 800 comprises the upper memory cell 801 and the lower memory cell 802, the local sense amp 810, the global sense amp 830, and the locking signal generator 880. In particular, the memory cell 801 is composed of a pass transistor 804 connecting to a word line 803 and a gate capacitor 805 connecting to a plate line, such that the gate capacitor can be formed from a MOS transistor. And other circuits are the same as FIG. 5.

Figure 9A:
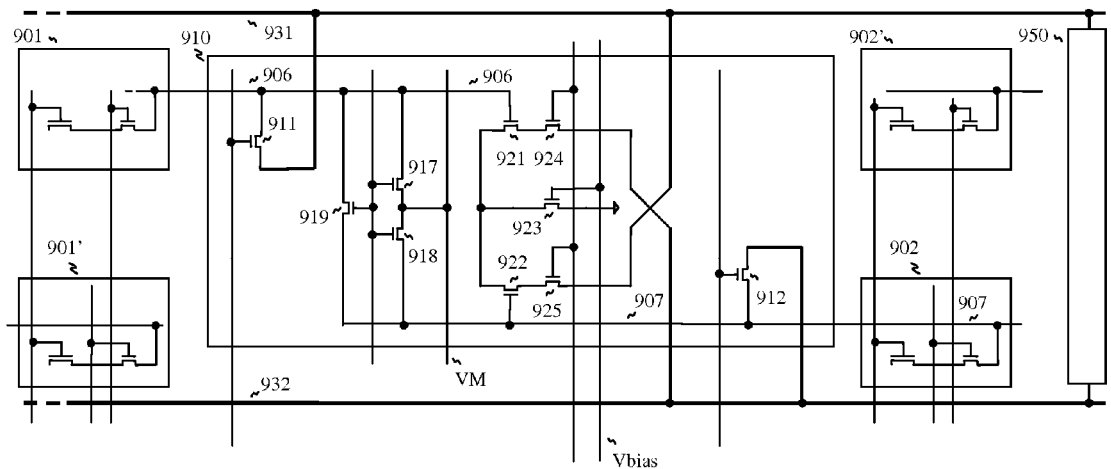
FIGS. 9A and 9B illustrate alternative configurations having a left local bit line and a right local bit line, according to the teachings of the present invention.

In FIG. 9A, alternative configurations having a left local bit line and a right local bit line is illustrated, wherein the local sense amp 910 includes a pair of local pre-charge transistors 917 and 918 for pre-charging the local bit line pair 906 and 907, an equalization transistor 919, a receiving transistor pair 921 and 922 as a differential input reading transistor pair for reading voltage difference of the local bit line pair 906 and 907, a sink transistor 923 for configuring a differential amplifier with the pair of local amplify transistors 921 and 922, a local enable transistor pair 924 and 925 connecting to an upper global bit line 931 and a lower global bit line 932 respectively. And the sink transistor 923 can be controlled by a bias voltage (Vbias) for increasing common mode rejection ratio in the differential amplifier alternatively. Particularly, the local bit line 906 is connected to the local sense amp 910 from left hand side, and the local bit line 907 is connected to the local sense amp 910 from right hand side, so that the local sense amp layout can be drawn wider pitch. The other memory cells 901' and 902' are connected to the other local sense amps (not shown), and the local sense amp is connected to the global sense amp 950 through the global bit line pair. And the operation is the same as FIG. 5.

Figure 9B:
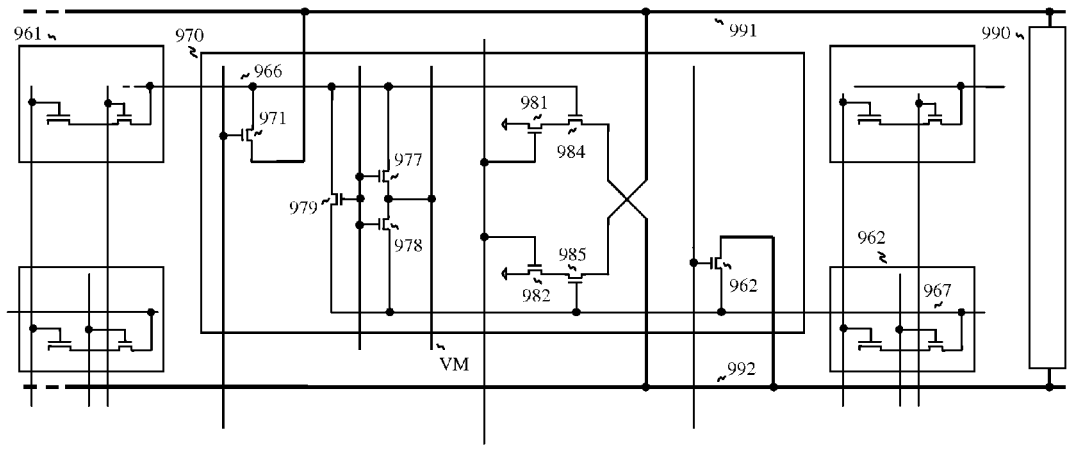

In FIG. 9B, another configurations having a left local bit line and a right local bit line is illustrated, wherein the configuration is similar to that of FIG. 9A, but no sink transistor is used. More specifically, the local sense amp 970 includes a pair of local pre-charge transistors 977 and 978 for pre-charging the local bit line pair 966 and 967, an equalization transistor 979, a pair of local amplify transistors 981 and 982 as a differential input reading transistor pair for reading voltage difference of the local bit line pair 966 and 967, where the pair of local amplify transistors is connected to an upper global bit line 931 and a lower global bit line 932. And a pair of local enable transistors 981 and 982 is connected to the pair of local amplify transistors for setting up current path when reading. The local bit line 966 is connected to the local sense amp 970 from left hand side, and the local bit line 967 is connected to the local sense amp 910 from right hand side, so that the local sense amp layout is can be drawn wider pitch without the sink transistor for reducing area. The local sense amp 970 is connected to the global sense amp 990 through the global bit line pair 991 and 992. And the operation is equal to that of FIG. 5, while common mode rejection ratio is slightly degraded, but area is reduced without the sink transistor.

Figure 10A:
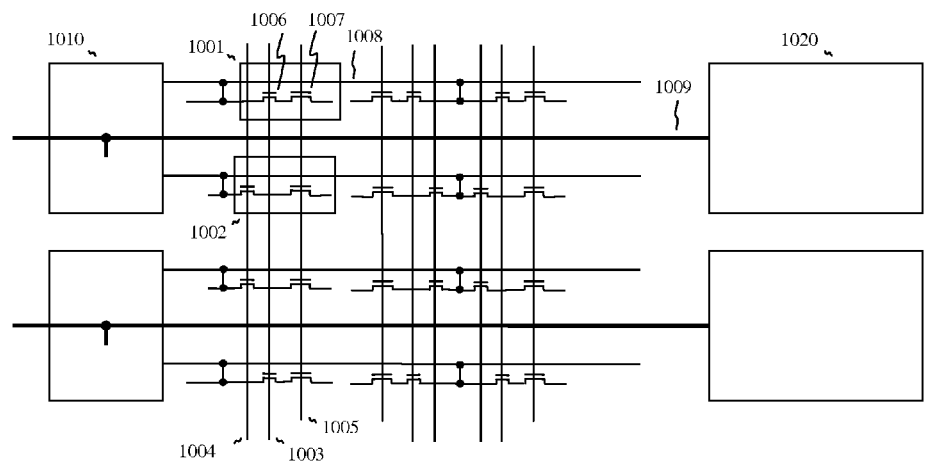
FIGS. 10A, 10B, 10C, 10D and 10E illustrate an example memory cell array with a gate capacitor for implementing the circuit, according to the teachings of the present invention.

In FIG. 10A, an example array circuit is illustrated for implementing the memory cell with a gate capacitor (shown 201 in FIG. 2A), wherein the memory cell 1001 is connected to the local bit line 1008, the local sense amp 1010 is connected to the local bit line 1008, and the global sense amp 1020 is connected to the local sense amp 1010 through the global bit line 1009. The memory cell 1001 is composed of the pass transistor 1006 and the gate capacitor 1007 as a storage element. And the gate capacitor 1007 is connected to the plate line 1005. The upper memory cell 1001 is connected to the right word line 1003, and the lower memory cell 1002 is connected to the left word line 1004, so that two memory cells are separately selected for configuring folded bit line architecture. And in FIGS. 10B, 10C, 10D, and 10E, the layouts for the memory cell array will be implemented as an example.

Figure 10B:
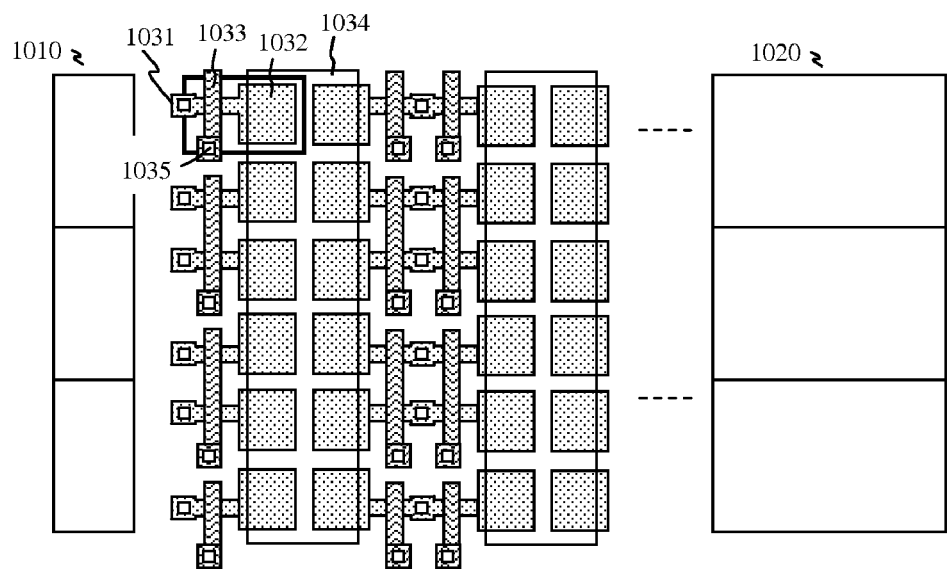
Figure 10C:
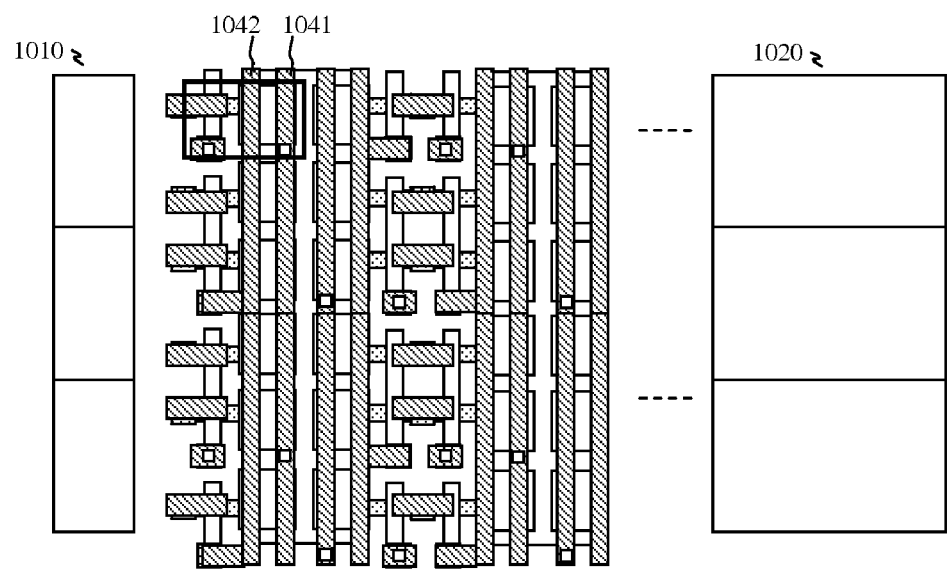
Figure 10D:
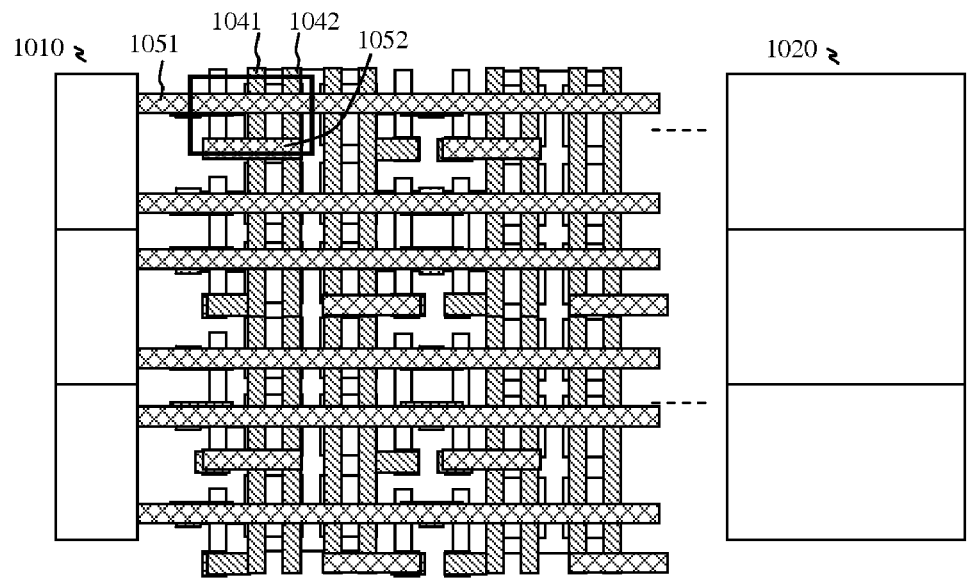
Figure 10E:
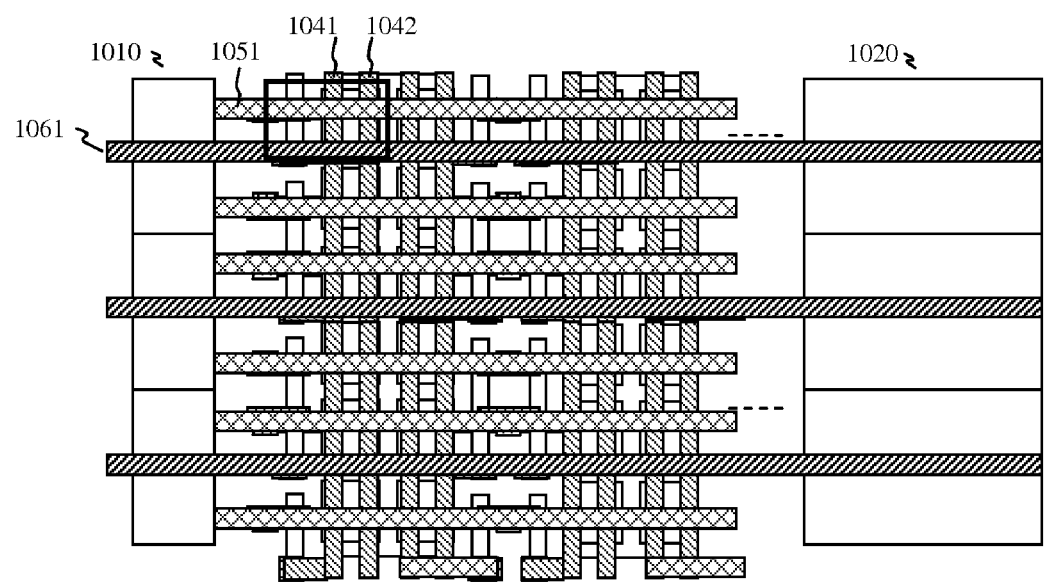

And in FIG. 10B, active layer 1031 and 1032 are formed under poly gate layer 1033 serving as the word line, and same poly layer 1034 as the plate line is formed on the active layer 1032 for configuring the storage capacitor with insulator (not shown), wherein the poly gate layer 1033 and 1034 are the same layer when forming. And a contact region 1035 is defined for connecting to the poly gate 1033. Referring now to FIG. 10C, metal-1 layer is defined, wherein the metal-1 region 1041 is formed for connecting to the right word line 1003 (in FIG. 10A), and another metal-1 region 1042 is formed for connecting to the adjacent memory cell 1002 as the left word line 1004 (in FIG. 10A). And in FIG. 10D, metal-2 layer is formed on the metal-1 layer, wherein the metal-2 region 1051 is formed as the local bit line, and the metal-2 region 1052 is formed for connecting the right word line to the upper memory cell. And in FIG. 10E, metal-3 region is formed, wherein the metal-3 region 1061 is formed for connecting the local sense amp 1010 to the global sense amp 1020 as the global bit line 1061.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a plurality of memory cells connecting to a local bit line pair, wherein the memory cell is composed of a pass transistor and a capacitor; and
   a local sense amp which is composed of a pair of local pre-charge transistors pre-charging the local bit line pair, a pair of local amplify transistors for receiving voltage difference of the local bit line pair, a pair of local enable transistors connecting to the pair of local amplify transistors in series connection, and a pair of local write transistors connecting to the local bit line pair for writing; and
   a global sense amp which is composed of a pair of global pre-charge transistors pre-charging the global bit line pair, a global cross-coupled latch including a pair of local pull-down transistors and a pair of pull-up transistors for connecting to a pair of global latch nodes, a pair of global read select transistors for connecting the global bit line pair to the pair of global latch nodes, a pair of global pre-set transistors pre-setting the pair of global latch nodes, a pair of global write drivers having a pair of level shifters which is connected to the global latch nodes, a pair of global write transistors, and a pair of data transfer transistors for connecting the global bit line pair to a pair of data lines; and
   a locking signal generator generating a locking signal for enabling and disabling the pair of local enable transistors, wherein the locking signal generator includes a delay circuit receiving a read enable signal; and
   a read path which includes the local sense amp connecting to the local bit line pair, the global sense amp connecting to the pair of local enable transistors of the local sense amp through the global bit line pair, wherein the read path is set up when reading, such that the pair of local enable transistors of the local sense amp is enabled for reading, the global sense amp receives an output from the local sense amp through the global bit line pair, and the locking signal disables the pair of local enable transistors after reading; and
   a write path which includes the pair of global write drivers driving the global bit line pair through the pair of global write transistors, the pair of local write transistors connecting the global bit line pair to the local bit line pair for transferring an output from the pair of global write drivers, wherein the write path is set up when writing a write data to the memory cell.

2. The memory device of claim 1, wherein the pair of local amplify transistors is connected to a sink transistor.

3. The memory device of claim 1, wherein the pair of local amplify transistors is connected to the pair of local enable transistors, and the global bit line pair is connected to the pair of local amplify transistors in series connection.

4. The memory device of claim 1, wherein the locking signal generator includes the delay circuit receiving an output from the global sense amp and the read enable signal.

5. The memory device of claim 1, wherein the memory cell is composed of a pass transistor connecting to a word line and a capacitor consisting of a regular dielectric capacitor.

6. The memory device of claim 1, wherein the memory cell is composed of a pass transistor connecting to a word line and a capacitor consisting of a ferroelectric capacitor.

7. The memory device of claim 1, wherein the memory cell is composed of a pass transistor connecting to a word line and a capacitor consisting of a gate capacitor.

8. A memory device, comprising:
   a plurality of memory cells connecting to a local bit line pair, wherein the memory cell is composed of a pass transistor and a capacitor; and
   a local sense amp which is composed of a pair of local pre-charge transistors pre-charging the local bit line pair, a pair of local amplify transistors for receiving voltage difference of the local bit line pair, a pair of local enable transistors connecting to the pair of local amplify transistors in series connection, and a pair of local write transistors connecting to the local bit line pair for writing; and
   a global sense amp which is composed of a pair of global pre-charge transistors pre-charging the global bit line pair, a global cross-coupled latch including a pair of local pull-down transistors and a pair of pull-up transistors for connecting to the global bit line pair, and a pair of data transfer transistors for connecting the global bit line pair to a pair of data lines; and
   a locking signal generator generating a locking signal for enabling and disabling the pair of local enable transistors, wherein the locking signal generator includes a delay circuit receiving a read enable signal; and
   a read path which includes the local sense amp connecting to the local bit line pair, the global sense amp connecting to the local sense amp through the global bit line pair, wherein the read path is set up when reading, such that the pair of local enable transistors of the local sense amp is enabled for reading, the global sense amp receives an output from the local sense amp through the global bit line pair, and the locking signal disables the pair of local enable transistors after reading; and
   a write path which includes the global sense amp driving the global bit line pair, the pair of local write transistors connecting the global bit line pair to the local bit line pair, wherein the write path is set up when writing a write data to the memory cell.

9. The memory device of claim 8, wherein the pair of local amplify transistors is connected to a sink transistor.

10. The memory device of claim 8, wherein the pair of local amplify transistors is connected to the pair of local enable transistors in series connection, and the global bit line pair is connected to the pair of local amplify transistors.

11. The memory device of claim 8, wherein the locking signal generator includes the delay circuit receiving an output from the global sense amp and the read enable signal.

12. The memory device of claim 8, wherein the memory cell is composed of a pass transistor connecting to a word line and a capacitor consisting of a regular dielectric capacitor.

13. The memory device of claim 8, wherein the memory cell is composed of a pass transistor connecting to a word line and a capacitor consisting of a ferroelectric capacitor.

14. The memory device of claim 8, wherein the memory cell is composed of a pass transistor connecting to a word line and a capacitor consisting of a gate capacitor.

* * * * *